(12) United States Patent
Sharf et al.

(10) Patent No.: US 8,123,572 B2
(45) Date of Patent: Feb. 28, 2012

(54) ELECTRICAL COMPONENTS HAVING A CONTACT CONFIGURED TO ENGAGE A VIA OF A CIRCUIT BOARD

(75) Inventors: Alex Michael Sharf, Harrisburg, PA (US); Robert Frederick, Enola, PA (US); Chad William Morgan, Woolwich Township, NJ (US)

(73) Assignee: Tyco Electronics Corporation, Berwyn, PA (US)

(*) Notice: Subject to any disclaimer, the term of this patent is extended or adjusted under 35 U.S.C. 154(b) by 112 days.

(21) Appl. No.: 12/753,585

(22) Filed: Apr. 2, 2010

(65) Prior Publication Data
US 2011/0244705 A1    Oct. 6, 2011

(51) Int. Cl.
*H01R 13/42* (2006.01)
(52) U.S. Cl. ......................................... 439/751
(58) Field of Classification Search .................. 439/751, 439/353, 78, 84
See application file for complete search history.

(56) References Cited

U.S. PATENT DOCUMENTS

| | | | |
|---|---|---|---|
| 3,446,908 A * | 5/1969 | Tally et al. ................ 174/266 |
| 3,601,750 A * | 8/1971 | Mancini ...................... 439/84 |
| 3,660,726 A * | 5/1972 | Ammon et al. ............ 174/262 |
| 3,681,744 A * | 8/1972 | Olsson ....................... 439/844 |
| 3,781,770 A * | 12/1973 | Mancini .................... 439/839 |
| 3,865,455 A * | 2/1975 | Berg et al. ................. 439/82 |
| 4,030,792 A * | 6/1977 | Fuerst ........................ 439/65 |
| 4,080,037 A * | 3/1978 | Kunkle et al. ............. 439/853 |
| 4,175,810 A * | 11/1979 | Holt et al. .................. 439/82 |
| 4,236,776 A * | 12/1980 | Wellington ................ 439/83 |
| 4,298,237 A * | 11/1981 | Griffith et al. ............. 439/60 |
| 4,446,505 A * | 5/1984 | Long et al. ................. 361/785 |
| 4,526,429 A * | 7/1985 | Kirkman .................... 439/82 |
| 4,575,167 A * | 3/1986 | Minter ....................... 439/83 |
| 4,583,807 A * | 4/1986 | Kaufman et al. ........... 439/83 |
| 4,812,130 A | 3/1989 | Altenschulte et al. |
| 4,906,198 A * | 3/1990 | Cosimano et al. .......... 439/82 |
| 4,978,307 A | 12/1990 | Billman et al. |
| 4,998,887 A * | 3/1991 | Kaufman et al. ........... 439/78 |
| 5,040,999 A * | 8/1991 | Collier ....................... 439/108 |
| 5,041,015 A | 8/1991 | Travis |
| 5,052,954 A * | 10/1991 | Seidler ....................... 439/876 |
| 5,082,460 A | 1/1992 | Legrady |
| 5,261,826 A * | 11/1993 | Leeb et al. ................. 439/67 |
| 5,565,654 A * | 10/1996 | Zell et al. .................. 174/265 |
| 5,761,050 A * | 6/1998 | Archer ....................... 361/791 |
| 5,823,830 A * | 10/1998 | Wurster ..................... 439/751 |

(Continued)

OTHER PUBLICATIONS

ACTION PIN Press-Fit Contacts: Tyco Electronics; 2 pgs.

*Primary Examiner* — Tulsidas C Patel
*Assistant Examiner* — Vladimir Imas (57) ABSTRACT

An electrical component configured to engage a circuit board having a thru-hole. The thru-hole has a plated portion of conductive material that includes an outward facing contact pad. The component includes a housing having a mounting surface that is configured to be mounted to the circuit board. The component also includes an electrical contact that is coupled to the housing and projects away from the mounting surface. The contact is configured to engage the thru-hole of the circuit board. The contact includes an elongated body that extends along a contact axis to a leading end that is configured to be inserted into a passage of the plated portion. The contact also includes an engagement projection that extends away from the body and is biased against the contact pad to maintain an electrical connection.

20 Claims, 8 Drawing Sheets

U.S. PATENT DOCUMENTS

| | | | |
|---|---|---|---|
| 5,893,779 A * | 4/1999 | Bianca et al. | 439/751 |
| 5,989,064 A | 11/1999 | Harlan et al. | |
| 6,074,249 A | 6/2000 | Beken et al. | |
| 6,083,340 A * | 7/2000 | Nomura et al. | 156/253 |
| 6,106,332 A | 8/2000 | Souisa | |
| 6,123,580 A | 9/2000 | Bendorf et al. | |
| 6,137,064 A * | 10/2000 | Kiani et al. | 174/266 |
| 6,181,219 B1 | 1/2001 | Gailus et al. | |
| 6,190,214 B1 * | 2/2001 | Bianca et al. | 439/751 |
| 6,541,712 B1 | 4/2003 | Gately et al. | |
| 6,593,535 B2 * | 7/2003 | Gailus | 174/262 |
| 6,651,322 B1 * | 11/2003 | Currie | 29/840 |
| 8,663,442 | 12/2003 | Helster et al. | |
| 7,240,425 B2 * | 7/2007 | Khilchenko et al. | 29/837 |
| 7,559,770 B2 * | 7/2009 | Di Stefano | 439/66 |
| 7,563,104 B2 * | 7/2009 | Kim et al. | 439/66 |
| 7,581,965 B1 * | 9/2009 | Upasani et al. | 439/82 |
| 7,963,776 B1 * | 6/2011 | Morgan | 439/75 |
| 7,988,457 B1 * | 8/2011 | Morgan | 439/65 |
| 2004/0051172 A1 | 3/2004 | Miyazaki et al. | |
| 2007/0197099 A1 * | 8/2007 | DiStefano | 439/620.1 |
| 2008/0057753 A1 * | 3/2008 | Rathburn et al. | 439/78 |
| 2008/0087460 A1 | 4/2008 | Fung | |
| 2009/0068858 A1 * | 3/2009 | Di Stefano | 439/66 |

* cited by examiner

ELECTRICAL COMPONENTS HAVING A CONTACT CONFIGURED TO ENGAGE A VIA OF A CIRCUIT BOARD

BACKGROUND OF THE INVENTION

The subject matter herein relates generally to electrical contacts for interconnecting electrical components and circuit boards, and more particularly to electrical contacts configured to engage thru-holes of circuit boards using axial forces.

Electrical connectors and components may be interconnected to circuit boards using electrical contacts that form a mechanical and electrical coupling with the circuit board. For example, circuit boards generally include a substrate having a plurality of thru-holes extending through a thickness of the substrate with a uniform diameter. The thru-holes are typically "plated," i.e., covered with a conductive material. Traces or other conductive pathways may be coupled to the conductive material of the thru-hole to form an electrical pathway from the thru-hole and throughout the circuit board. To connect the circuit board to an electrical component, such as a connector, electrical contacts from the connector are inserted into the thru-holes. Each contact forms an interference fit within a passage of the thru-hole. For example, eye-of-needle compliant contacts include a pair of members that exert a radially outward force against an interior surface of the passage.

However, the compliant contacts may require that the passage of the thru-hole extend at least a predetermined length (e.g., 1.2 millimeters) in order to make sufficient mechanical and electrical contact. Such lengths may negatively affect transmission through the thru-holes. Furthermore, the interconnection between the compliant contacts and the interior surfaces of the passages may have electrical limitations when used in certain applications, such as high-speed applications.

Accordingly, there is a need for electrical contacts capable of mechanically and electrically connecting to thru-holes having passages with limited lengths. There is also a need for electrical contacts that are capable of mechanically and electrically connecting to thru-holes using other methods than used by known compliant contacts. In addition, there is a need for electrical contacts that perform better in high-speed applications than the known compliant contacts.

BRIEF DESCRIPTION OF THE INVENTION

In one embodiment, an electrical component configured to engage a circuit board having a thru-hole is provided. The thru-hole has a plated portion of conductive material that includes an outward facing contact pad. The component includes a housing having a mounting surface that is configured to be mounted to the circuit board. The component also includes an electrical contact that is coupled to the housing and projects away from the mounting surface. The contact is configured to engage the thru-hole of the circuit board. The contact includes an elongated body that extends along a contact axis to a leading end that is configured to be inserted into a passage of the plated portion. The contact also includes an engagement projection that extends away from the body and is biased against the contact pad to maintain an electrical connection.

In another embodiment, an electrical assembly is provided that includes a circuit board having a substrate that includes a thru-hole. The thru-hole has a plated portion of conductive material. The plated portion includes a contact pad that has a mating surface and a passage extending from the contact pad. The mating surface is recessed with respect to one of the substrate surfaces. The electrical assembly also includes an electrical component that has a housing that is configured to be mounted to the circuit board and an electrical contact that extends from the housing. The contact is configured to engage the thru-hole of the circuit board. The contact has an elongated body that extends along a contact axis to a leading end that is configured to be inserted into the passage of the plated portion. The body includes an engagement projection extending therefrom that is biased against the contact pad to maintain an electrical connection. Optionally, there may be more than one contact pad.

In another embodiment, a circuit board is provided that includes a substrate having opposite substrate surfaces and a thru-hole that is configured to engage an electrical contact. The thru-hole has a plated portion of conductive material that forms a contact pad that includes a mating surface sized and shaped to engage an electrical contact and a passage that extends from the contact pad. The passage is configured to receive the contact, and the mating surface is recessed with respect to and faces one of the substrate surfaces.

DETAILED DESCRIPTION OF THE INVENTION

Figure 1:
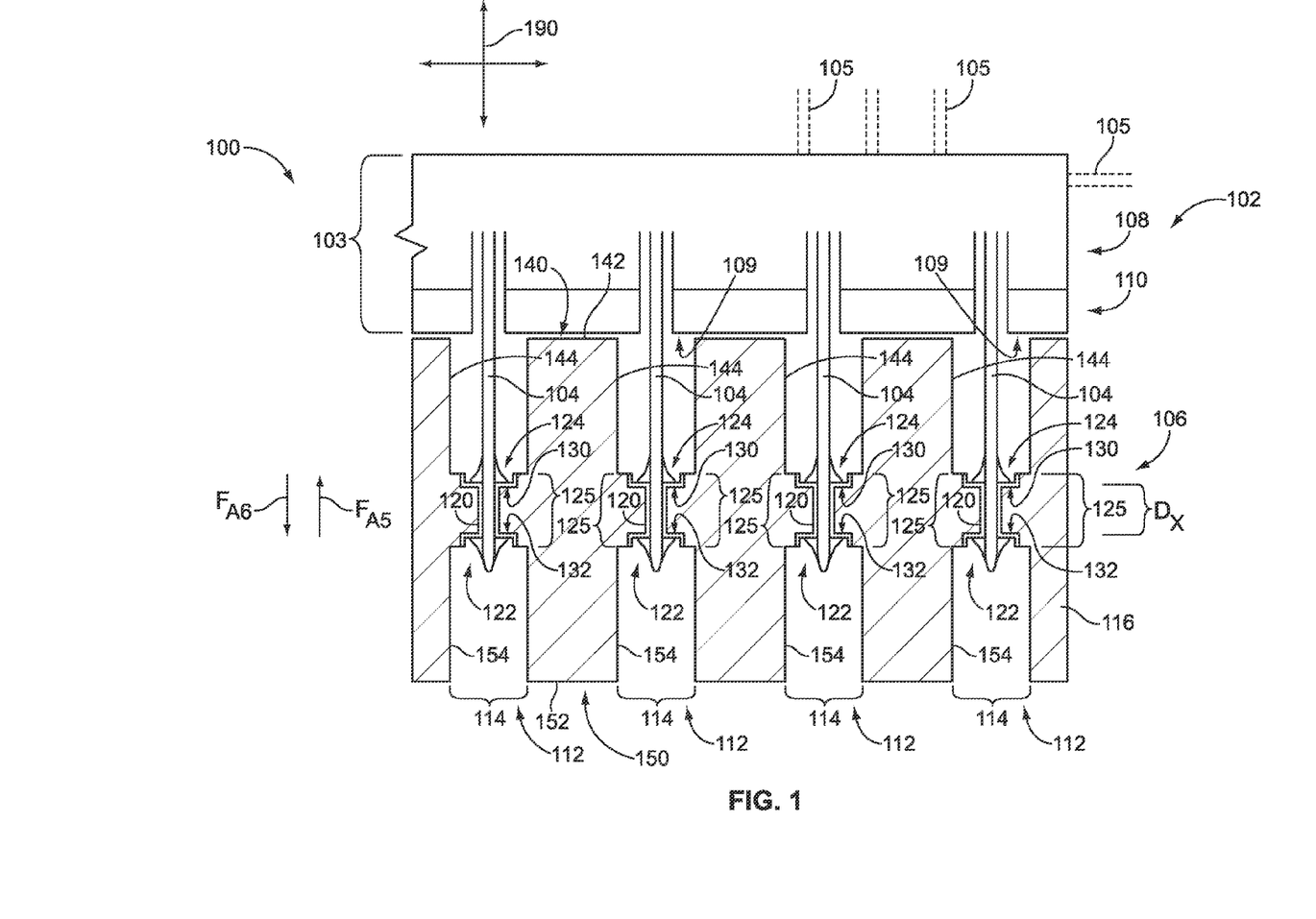
FIG. 1 is a side cross-sectional view of a portion of an electrical assembly formed in accordance with one embodiment.

FIG. 1 is a side cross-sectional view of a portion of an electrical assembly 100 that includes an electrical component 102 mounted to a circuit board 106. The component 102 has a housing 103 and a plurality of electrical contacts 104 that are coupled to the housing 103 and are configured to engage the circuit board 106. In the illustrated embodiment, the component 102 includes an electrical connector 108 and an organizer 110 that provides structural support for the contacts 104 and the connector 108. The connector 108 may have additional electrical contacts 105 (indicated by dashed lines) that are configured to engage another circuit board or another electrical component (not shown). However, the component 102 is not limited to being or including a connector, but may be any electrical device, module, or system. Also shown, the contacts 104 project away from the component 102 and are mechanically and electrically engaged to corresponding thru-holes or vias 112 in the circuit board 106.

The circuit board 106 has a substrate 116 with opposing sides 140 and 150. Each thru-hole 112 has a bore 114 extending along a longitudinal or bore axis 190 through the substrate 116 between the sides 140 and 150. The side 140 includes a substrate surface 142 configured to interface with a mounting surface 109 of the electrical component 102 and bore surfaces 144 formed when the bores 114 are made. The side 150 includes a substrate surface 152 and bore surfaces 154 formed when the bores 114 are made. The thru-holes 112 also have conductive material 120 that is plated onto a portion or portions of the bore surfaces 144 and 154. In alternative embodiments, the conductive material 120 may be plated onto the substrate surfaces 142 and 152. As shown, the contacts 104 are mechanically and electrically engaged to the conductive material 120 of the thru-holes 112. Specifically, each contact 104 is engaged to the conductive material 120 that is plated on the corresponding bore surface 144 of the side 140 and also engaged to the conductive material 120 that is plated on the corresponding bore surface 154 of the side 150. Although not shown, the conductive material 120 may be coupled to pads or traces (not shown) that extend into or along the substrate 116.

Embodiments described herein provide electrical contacts that create axial forces configured to maintain a mechanical and electrical connection or engagement between the electrical contacts and corresponding thru-holes. For example, each thru-hole 112 may have a plated portion 125 comprising a conductive material 120 that is configured to engage the contact 104. The plated portion 125 may have outward-facing mating surfaces 130 and 132 of corresponding contact pads having an axial distance $D_X$ extend therebetween. The mating surface 130 is plated onto the bore surface 144 of the corresponding thru-hole 112 and is proximate to and faces the housing 103 of the component 102. The mating surface 132 is plated onto the bore surface 154 and faces away from the housing 103. The mating surfaces 130 and 132 face in substantially opposite directions along the longitudinal axis 190 and are sized and shaped to engage the contacts 104. In alternative embodiments, the plated portions 125 extend entirely through the substrate 116 so that the axial distance $D_X$ is a thickness of the substrate 116 and the mating surfaces 130 and 132 are plated along the substrate surfaces 142 and 152. In some embodiments, the axial distance $D_X$ is less than one millimeter, but may be longer in other embodiments.

As shown in FIG. 1, each contact 104 may have one or more engagement projections 122 that are configured to press against the mating surface 132 of the plated portion 125 through an axial force $F_{A5}$ that extends along the longitudinal axis 190. As such, the mating surface 132 may be sized and shaped to engage the corresponding engagement projection 122 so that an electrical current may be transmitted therethrough. Optionally, the contacts 104 may include a trailing element 124 that is configured to engage the mating surface 130 to exert an opposing axial force $F_{A6}$. The element 124 may be, for example, another engagement projection or a collar. The opposing axial forces $F_{A5}$ and $F_{A6}$ are configured to press against the mating surfaces 130 and 132 and maintain the electrical engagement between the contacts 104 and the conductive material 120 of the corresponding thru-hole 112. Embodiments described herein also provide circuit boards, such as the circuit board 106, having thru-holes configured to electrically engage the contacts 104. As shown in FIG. 1 and as will be described in greater detail below, the thru-holes may be plated with conductive material that form mating surfaces, which are recessed with respect to corresponding substrate surfaces.

Figure 2:
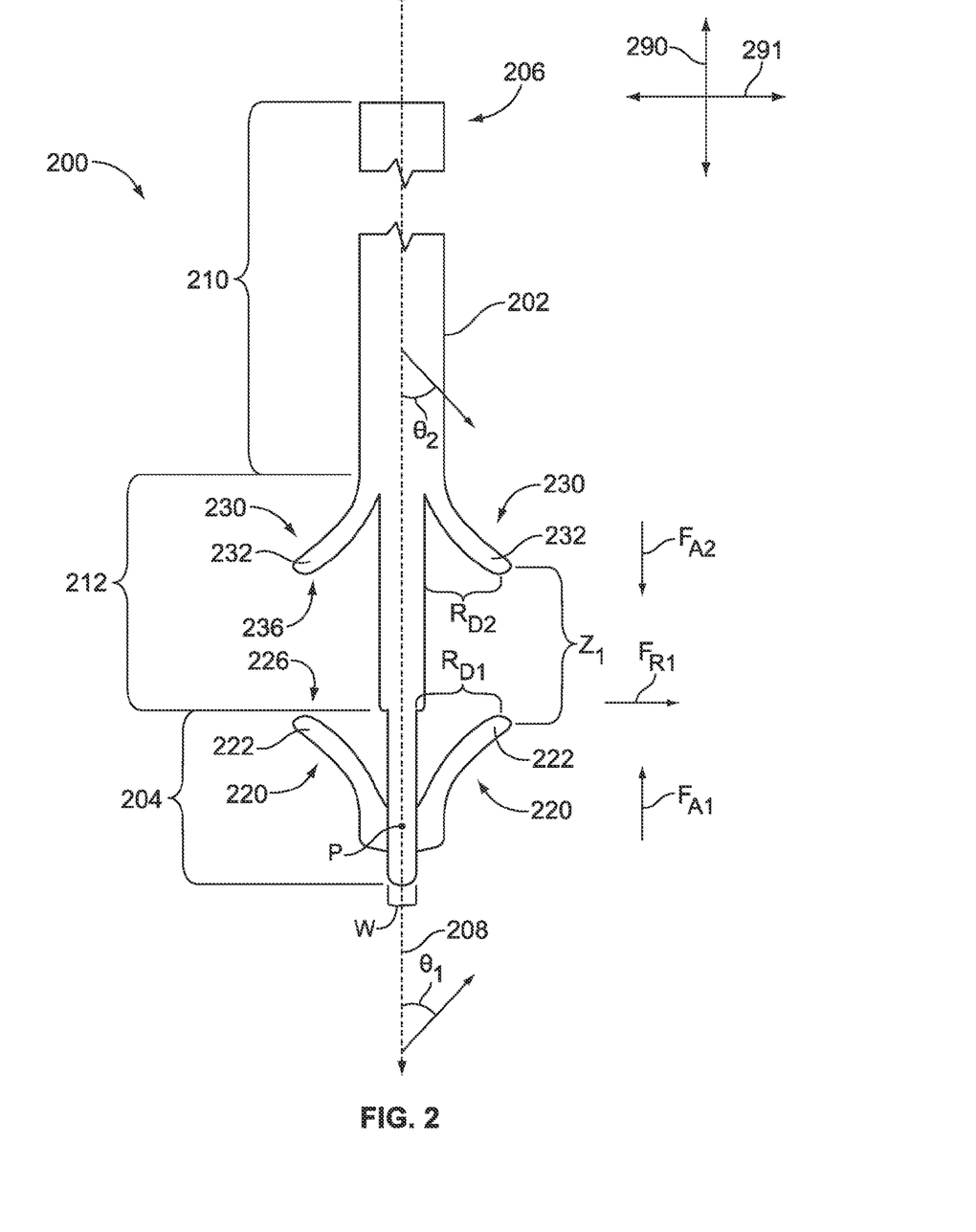
FIG. 2 is a side view of an electrical contact formed in accordance with an embodiment.

FIG. 2 is a side view of an electrical contact 200 that may be used with the electrical assembly 100 (FIG. 1). Contacts described herein are generally stamped and formed from sheet metal, however, the contacts may be manufactured using other methods. As shown in FIG. 2, the contact 200 has an elongated body 202 that includes a leading end 204, a trailing portion 206, and a contact axis 208 extending therebetween. The contact axis 208 may extend parallel to a longitudinal axis 290. The body 202 includes the leading end 204, a base portion 210 proximate to or extending from the trailing portion 206, and an intermediate or contact portion 212 that extends between the base portion 210 and the leading end 204.

The body 202 may include one or more engagement projections 220 joined to and extending from the leading end 204 and away from the body 202 and toward the trailing portion 206. As will be described in greater detail below, the engagement projection 220 is configured to be biased against a corresponding contact pad of a thru-hole to maintain an electrical connection or engagement. The engagement projection 220 extends outward from the body 202 at an acute angle $\theta_1$ with respect to the contact axis 208. In the illustrated embodiment, the contact 200 has a pair of engagement projections 220 that project away from each other from a common axial position P along the contact axis 208 of the body 202. At the axial position P, the pair of engagement projections 220 are separated from each other by a diameter or width W of the body 202. In alternative embodiments, the body 202 may have only one engagement projection 220 or three or more engagement projections 220 extending outward from the body 202.

Each engagement projection 220 has a distal tip 222. As shown in FIG. 2, the engagement projections 220 are in a relaxed state or condition such that each distal tip 222 is located a radial distance $R_{D1}$ away from the body 202. The engagement projection 220 may be shaped such that the engagement projection 220 extends substantially along the contact axis 208 when proximate to the body 202 and substantially along a radial line or lateral axis 291 when proximate to the distal tip 222. For example, the engagement projection 220 may curve away from the body 202 as the engagement projection 220 extends to the distal tip 222. Also shown, the distal tips 222 may form contact surfaces 226 that are configured to engage a thru-hole. The contact surfaces 226 may be configured to extend substantially along the lateral axis 291 when engaged to the thru-hole.

The engagement projection 220 is configured to resiliently flex toward and away from the body 202 (i.e., resist moving away from the relaxed condition). Accordingly, when the engagement projection 220 is moved in a radially inward direction toward the contact axis 208, the engagement projection 220 resists deflection with a radially outward force $F_{R1}$. When the engagement projection 220 is moved toward the leading end 204 such that the distal tip 222 is moved along the longitudinal axis 290, the distal tip 222 may arc away from the body 202 and toward the leading end 204. Furthermore, the engagement projection 220 may resist deflection with an axially directed force $F_{A1}$ toward the trailing portion 206 (i.e., in a direction that extends along the contact axis 208).

The contact 200 may also include one or more engagement projections 230 that extend from the body 202 in a direction along the contact axis 208 that is toward the leading end 204 and away from the body 202. The engagement projection 230 may also extend outward from the body 202 at an acute angle $\theta_2$ to the contact axis 208. Each engagement projection 220 may flare out from the body 202 and toward a corresponding engagement projection 230. Likewise, each engagement projection 230 may flare out from the body 202 and toward a corresponding engagement projection 220. Also shown, each engagement projection 230 extends to a corresponding distal tip 232. When the engagement projections 230 are in a relaxed state or condition, each distal tip 232 is located a radial distance $R_{D2}$ away from the body 202. The engagement projection 230 may be shaped such that the engagement projection 230 extends substantially along the contact axis 208 when proximate to the body 202 and substantially along the lateral axis 291 when proximate to the distal tip 232. For example, the engagement projections 230 may also curve away from the contact axis 208. The distal tips 232 may form contact surfaces 236 that are configured to engage surfaces of a thru-hole. Similar to the engagement projections 220, the engagement projection 230 is configured to resist flexing away from the body 202. More specifically, when the distal tip 232 of the engagement projection 230 is moved by a force toward the trailing portion 206, the distal tip 232 may arc away from the body 202 and toward the trailing portion 206. The engagement projection 230 may also resist deflection with an axially directed force $F_{A2}$ toward the leading end 204. Also shown, the distal tips 232 and 222 of the engagement projections 230 and 220, respectively, are separated or spaced apart by an axial distance $Z_1$ when the engagement projections 230 and 220 are in relaxed conditions.

Figure 3:
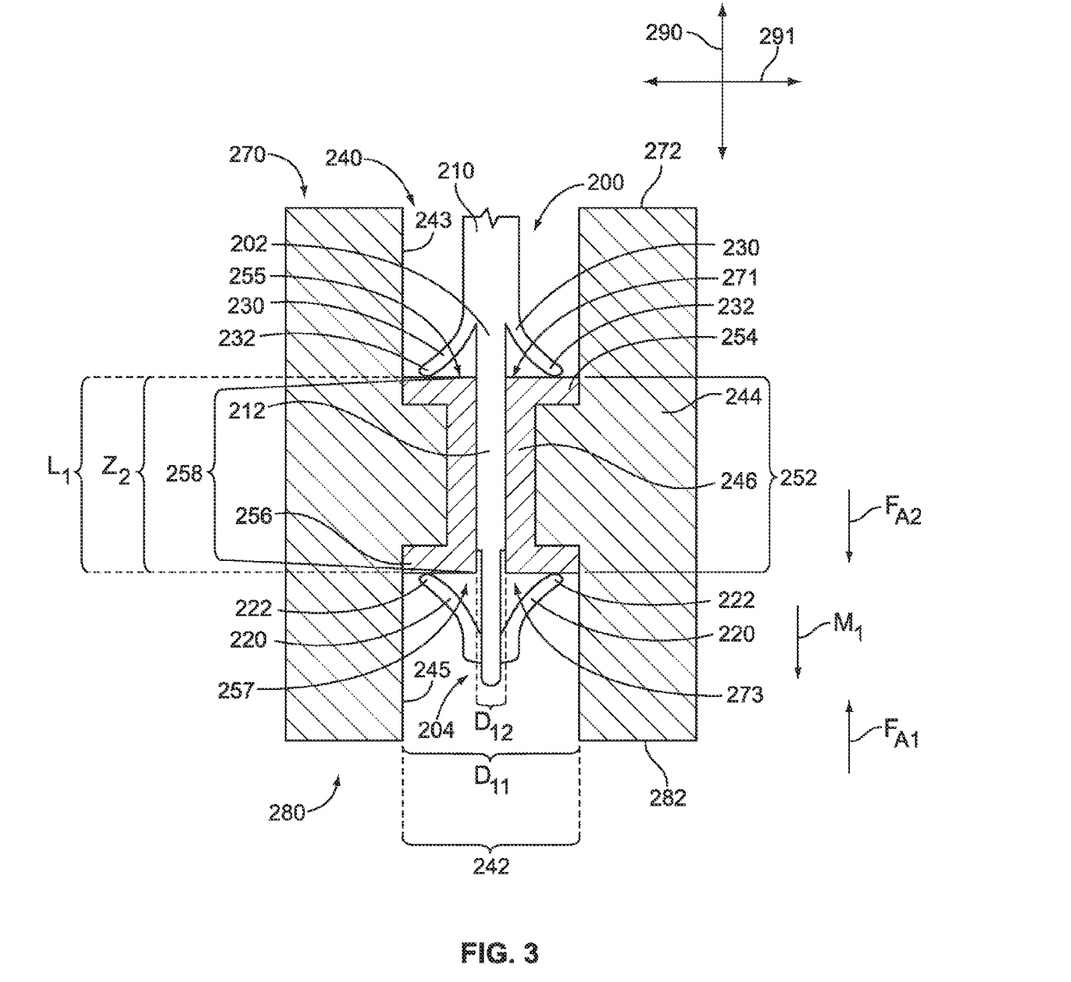
FIG. 3 is a cross-sectional side view of a thru-hole that is mechanically and electrically engaged with the contact of FIG. 2.

FIG. 3 shows the contact 200 electrically engaged with a portion of a thru-hole 240 in a substrate 244 of a circuit board (not shown). The substrate 244 has opposing sides 270 and 280. The thru-hole 240 includes a bore 242 that extends through the substrate 244. The bore 242 has bore surfaces 243 and 245 and may have a base diameter $D_{11}$. The thru-hole 240 also includes conductive material 246 that is plated onto the bore surfaces 243 and 245 of the bore 242. For example, the bore 242 may have a plated portion 252 of the conductive material 246 that includes contact pads 254 and 256 and a passage 258 extending therebetween. The contact pads 254 and 256 have outward facing mating surfaces 255 and 257, respectively, that may face opposite directions with respect to each other. The passage 258 extends between a pair of ends 271 and 273 of the passage 258. The contact pad 254 surrounds the end 271, and the contact pad 256 surrounds the end 273. Also shown, the mating surfaces 255 and 257 of the contact pads 254 and 256 are separated by an axial distance $Z_2$. The conductive material 246 of the passage 258 may form an electrical pathway between the contact pads 254 and 256 and may also be electrically coupled to traces or other pads (not shown) within the substrate 244. The passage 258 has a passage diameter $D_{12}$ that is smaller than the base diameter $D_{11}$ of the bore 242. Also shown, the contact pads 254 and 256 have a diameter that is substantially equal to the base diameter $D_{11}$.

The contact 200 is configured to mechanically and electrically engage both sides 270 and 280 of the substrate 244. The side 270 includes the bore surface 243, the contact pad 254, and a substrate surface 272, and the side 280 includes the bore surface 245, the contact pad 256, and a substrate surface 282. As shown, the contact pads 254 and 256 are plated onto the bore surfaces 243 and 245, respectively. However, in alternative embodiments, the contact pads 254 and 256 may be plated along the substrate surfaces 272 and 282 of the sides 270 and 280, respectively. Furthermore, in alternative embodiments, the plated portion 252 only has one contact pad 254 or 256 so that the contact 200 electrically engages only one side. However, in such embodiments, the contact 200 may still mechanically engage both sides 270 and 280.

When the contact 200 is coupled to the thru-hole 240, the leading end 204 is first inserted into the passage 258 and moved in a mating direction $M_1$ along the longitudinal axis 290. When the engagement projections 220 are in the relaxed condition, the engagement projections 220 span a greater distance than the diameter $D_{12}$ (i.e., twice the radial distance $R_{D1}$ (FIG. 2) plus the width W (FIG. 2) of the body 202). Accordingly, the engagement projections 220 are deflected toward the body 202 so that the leading end 204 may be advanced therethrough. In the illustrated embodiment, the leading end 204 enters the passage 258 at the end 271 before the distal tips 222 enter the passage 258 at the end 271.

The leading end 204 may continue to advance along the longitudinal axis 290 after clearing the end 273 of the passage 258. When the distal tips 222 clear the passage 258, the engagement projections 220 may flex radially outward and away from the body 202 and toward the relaxed condition. Before or when the distal tips 222 clear the contact pad 256, the distal tips 232 of the engagement projections 230 may engage the conductive material 246 of the contact pad 254 and exert the force $F_{A2}$ against the contact pad 254 in an engaged condition. When engaged to the plated portion 252, the engagement projections 220 and 230 are biased against the mating surfaces 257 and 255, respectively, to maintain an electrical connection. The engagement projections 220 may be shaped and oriented to resist being moved in a direction opposite to the mating direction $M_1$ when in an engaged condition and exert the force $F_{A1}$ against the contact pad 256. When the engagement projections 220 and 230 are in the respective engaged conditions, the engagement projections 220 and 230 may be spaced apart from each other by the axial distance $Z_2$, which may be greater than the axial distance $Z_1$ (FIG. 2). Accordingly, the contact 200 may exert opposing axial forces $F_{A1}$ and $F_{A2}$ towards each other and against the contact pads 256 and 254, respectively, when the contact 200 is mechanically and electrically engaged to the thru-hole 240. The opposing axial forces $F_{A1}$ and $F_{A2}$ may facilitate maintaining an electrical connection between the engagement projections 220 and 230 of the contact 200 and the corresponding contact pads 254 and 256 of the thru-hole 240.

When the contact 200 is engaged with the thru-hole 240, the contact portion 212 is surrounded by the passage 258, the leading end 204 projects away from the contact pad 256 in the bore 242 on the side 280 of the substrate 244, and the base portion 210 projects into the bore 242 on the side 270 of the substrate 244. As shown, the leading end 204 is relatively short as compared to the contact portion 212 and the base portion 210. However, the leading end 204 may be longer in other embodiments.

Moreover, the passage 258 may have a length $L_1$ that may be, for example, approximately equal to the axial distance $Z_2$. As shown, the length $L_1$ is greater than the base diameter $D_{11}$ of the bore 242 in the illustrated embodiment. However, in other embodiments, the length $L_1$ may be reduced to improve electrical properties or characteristics of the thru-hole 240. For example, the length $L_1$ may be less than the base diameter $D_{11}$. The length $L_1$ may be less than about 1.0 mm in some embodiments, less than about 0.75 mm in other embodiments, and less than about 0.50 mm in other embodiments. The length $L_1$ may be less than a length of thru-holes or vias that are required for known eye-of-needle compliant contacts.

Figure 4:
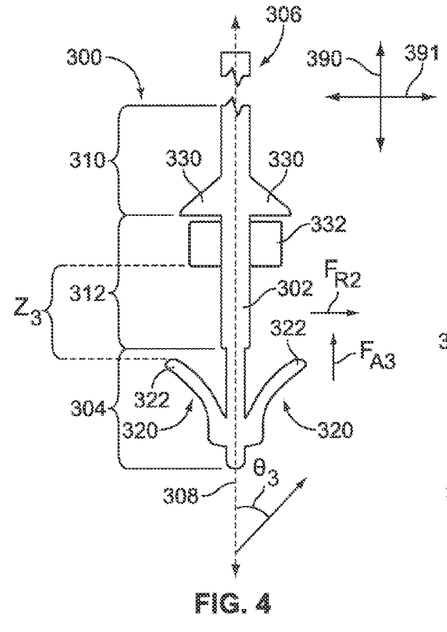
FIG. 4 is a side view of an electrical contact formed in accordance with another embodiment.

FIG. 4 is a side view of an electrical contact 300 that may also be used with the electrical assembly 100 (FIG. 1). The contact 300 has an elongated body 302 that includes a leading end 304, a trailing portion 306, and a contact axis 308 extending therebetween. The contact axis 308 may extend parallel to a longitudinal axis 390. The body 302 includes the leading end 304, a base portion 310 proximate to the trailing portion 306, and an intermediate or contact portion 312 that extends between the base portion 310 and the leading end 304.

The body 302 may include one or more engagement projections 320 that extend from the leading end 304 to respective distal tips 322. The engagement projection 320 extends outward from the body 302 at an acute angle $\theta_3$ to the contact axis 308. As shown, each engagement projection 320 may extend away from the body 302 and toward the trailing portion 306. The engagement projections 320 and leading end 304 may be similar to the engagement projections 220 (FIG. 2) and the leading end 204 (FIG. 2). Furthermore, the engagement projection 320 may be configured to resiliently flex toward and away from the body 302. Accordingly, when the distal tip 322 is moved in a radially inward direction toward the contact axis 308, the engagement projection 320 resists deflection with a radially outward force $F_{R2}$ away from the contact axis 308. When the distal tip 322 is moved by a force toward the leading end 304, the engagement projection 320 resists deflection with an axial force $F_{A3}$ toward the trailing portion 306.

Also shown in FIG. 4, the body 302 may also have engagement projections 330 extending radially outward from the base portion 310 and away from the contact axis 308. The contact 300 may also include a collar 332 that surrounds the body 302 about the contact axis 308 and may be positioned adjacent to the engagement projections 330. The collar 332 may be manufactured from a compressible material, such as an elastomeric material. In an alternative embodiment, the collar 332 may be a spring coil. As shown in FIG. 4, the collar 332 is in a relaxed condition. The distal tips 322 of the engagement projections 320 and the collar 332 may be spaced apart or separated by an axial distance $Z_3$ when the collar 332 and the engagement projections 320 are in relaxed conditions.

Figure 5:
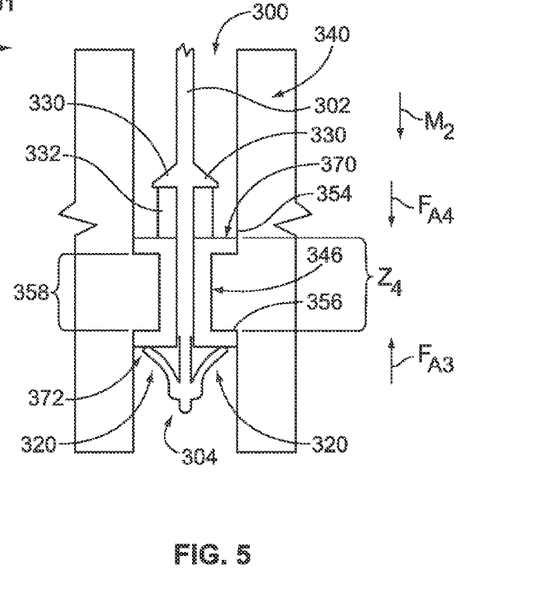
FIG. 5 is a cross-sectional side view of a thru-hole that is mechanically and electrically engaged with the contact of FIG. 4.

FIG. 5 shows the contact 300 engaged with a thru-hole 340. The thru-hole 340 may have similar features as the thru-hole 240 (FIG. 3) including conductive material 346 that forms contact pads 354 and 356 that are electrically coupled through a passage 358. The passage 358 may extend between a pair of ends 370 and 372 where the contact pad 354 surrounds the end 370 and the contact pad 356 surrounds the end 372. The ends 370 and 372 and corresponding surfaces of the contact pads 354 and 356 may be separated by an axial distance $Z_4$. To engage the contact 300 and the thru-hole 340, the leading end 304 of the body 302 may be inserted through the passage 358 along a mating direction $M_2$. The engagement projections 320 may resist movement toward the body 302 when the end 370 or an interior surface of the passage 358 deflects the engagement projections 320 toward the body 302. The engagement projections 320 may flex or spring radially outward and away form the body 302 when the engagement projections 320 clear the contact pad 356. Before or when the engagement projections 320 clear the contact pad 356, the collar 332 may be compressed between the engagement projections 330 and the contact pad 354. Alternatively, the body 302 only has one engagement projection 330 that surrounds the contact axis 308. When the collar 332 is in an engaged condition as shown in FIG. 5, the collar 332 exerts an axial force $F_{A4}$ against the contact pad 354.

The engagement projections 320 may be shaped and oriented to resist being moved in a direction opposite to the mating direction $M_2$ when in an engaged condition and exert the force $F_{A3}$ against the contact pad 356. When the engagement projections 320 and the collar 332 are in the respective engaged conditions, the engagement projections 320 and the collar 332 may be spaced apart from each other by the axial distance $Z_4$, which may be greater than the axial distance $Z_3$ (FIG. 4). Accordingly, the contact 300 may exert opposing axial forces $F_{A3}$ and $F_{A4}$ towards each other and against the contact pads 356 and 354, respectively, when the contact 300 is electrically engaged to the thru-hole 340. The opposing axial forces $F_{A3}$ and $F_{A4}$ may facilitate maintaining an electrical connection between the engagement projections 320 and the contact pad 356.

Figure 6:
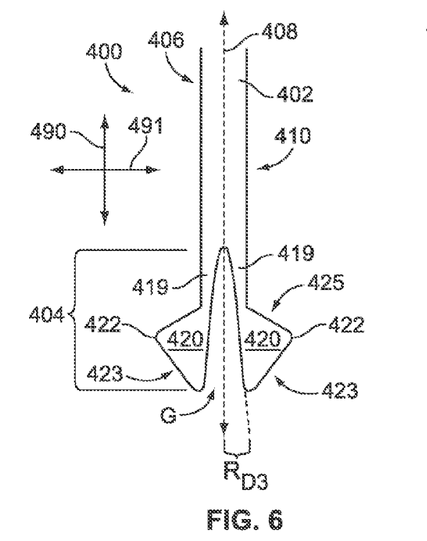
FIG. 6 is a side view of an electrical contact formed in accordance with another embodiment.
Figure 7:
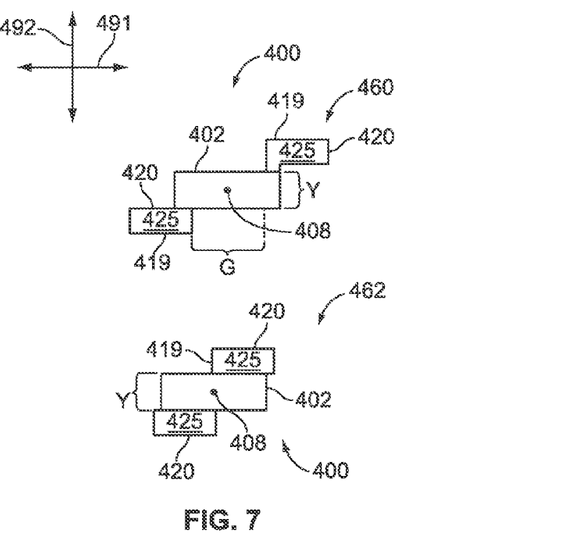
FIG. 7 is a top-down view of the contact of FIG. 6 showing relaxed and compressed conditions.
Figure 8:
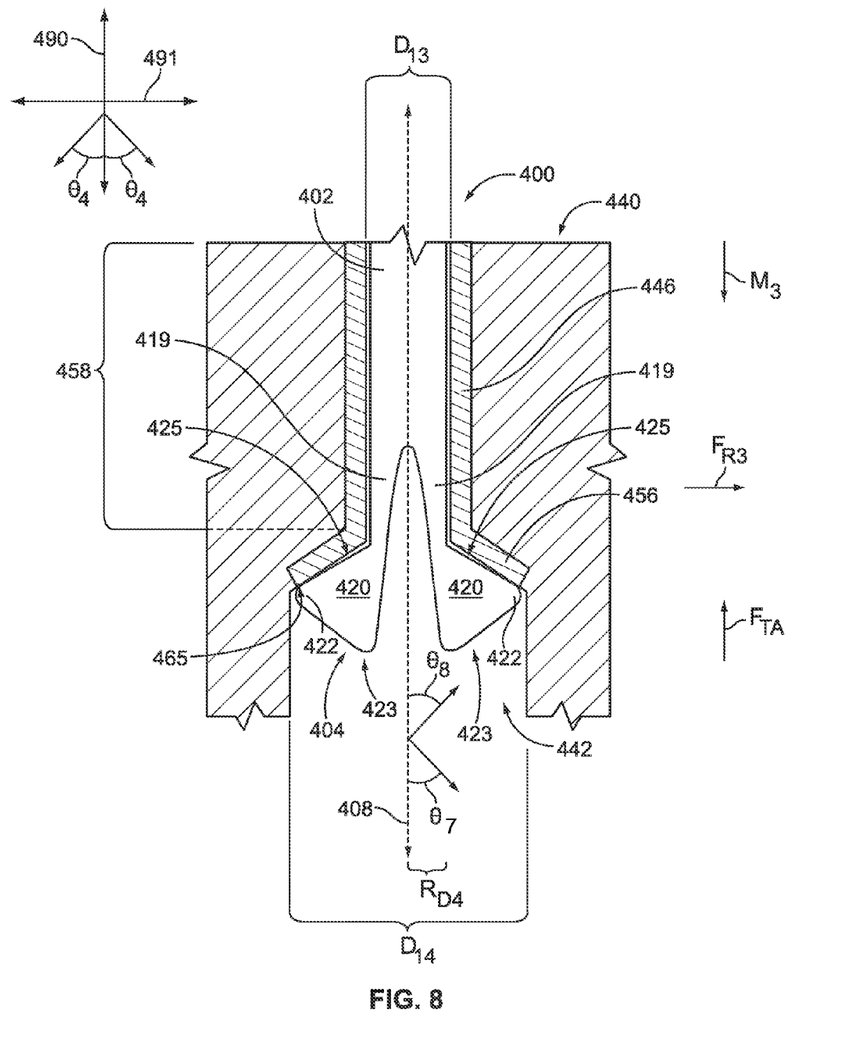
FIG. 8 is a cross-sectional side view of a thru-hole that is electrically engaged with the contact of FIG. 6.

FIGS. 6-8 illustrate an electrical contact 400 formed in accordance with another embodiment and that may also be used with the electrical assembly 100 (FIG. 1). FIG. 6 is a side view of the contact 400, which may include an elongated body 402 having a leading end 404, a trailing portion 406, and a contact axis 408 extending therebetween. The contact axis 408 may extend parallel to a longitudinal axis 490. The body 402 includes a base portion 410 that extends from the trailing portion 406 to the leading end 404.

The leading end 404 of the body 402 may form a pair of legs 419 that extend substantially parallel to the contact axis 408. The legs 419 may be spaced apart from each other along a lateral axis 491 by a gap G. As shown, the legs 419 are in a relaxed condition and are disposed a radial distance $R_{D3}$ from the contact axis 408. Each leg 419 includes an engagement projection 420 that extends radially outward from the contact axis 408 to a distal tip 422. Each engagement projection 420 may have a forward-facing leading edge 423 and a rearward facing gripping edge 425. The leading and gripping edges 423 and 425 extend away from the contact axis 408 and toward each other. Specifically, the leading edge 423 extends from the leading end 404 to the distal tip 422 in a direction toward the trailing portion 406. The gripping edge 425 may extends to the distal tip 422 in a direction toward the leading end 404. Both the gripping and leading edges 425 and 423 may extend at an angle $\theta_7$ and $\theta_8$ (shown in FIG. 8), respectively, with respect to the contact axis 408. The leading and gripping edges 423 and 425 join each other at the distal tip 422. For example, the engagement projections 420 may have a substantially triangular shape.

FIG. 7 is a top-down view of the contact 400 along the contact axis 408 showing the legs 419 in a relaxed condition 460 and a compressed or engaged condition 462. As shown, the gripping edges 425 of the engagement projections 420 face the trailing portion 406 (FIG. 6). In some embodiments, the legs 419 curve away from the contact axis 408 along another axis 492 that is perpendicular to the lateral axis 491 and the longitudinal axis 490 (FIG. 6). As such, in the relaxed condition 460, the legs 419 are not only separated by the gap G along the lateral axis 491, but are also separated by a distance Y along the axis 492. When the legs 419 are moved into the compressed condition 462, the legs 419 move toward each other along the lateral axis 491 such that the gap G reduces. As shown, the gap G may reduce so much that the engagement projections 420 overlap each other. In alternative embodiments, the distance Y may also reduce when the legs 419 are moved from the relaxed condition 460 to the compressed condition 462.

FIG. 8 is a side view of a portion of the contact 400 when electrically engaged with a thru-hole 440 (only a portion of the thru-hole 440 is shown). The thru-hole 440 may include a conductive material 446 that forms a contact pad 456 and a passage 458. The passage 458 may be electrically coupled to traces and other contact pads (not shown). The contact pad 456 is shaped and oriented to engage the leading end 404 of the contact 400 and may include a mating surface 465 that is sized and shaped to engage the gripping edges 425. The contact pad 456 faces away from a connector (not shown) that is coupled to the contact 400 at the trailing portion 406 (FIG. 6), and the contact pad 456 forms a non-orthogonal angle $\theta_4$ with respect to the longitudinal axis 490 such that the conductive material 446 of the contact pad 456 dovetails away from the conductive material 446 of the passage 458. More specifically, the passage 458 may have a passage diameter $D_{13}$ and a bore 442 of the thru-hole 440 may have a bore diameter $D_{14}$ in which the bore diameter $D_{14}$ is greater than the passage diameter $D_{13}$. As the thru-hole 440 transitions from the bore diameter $D_{14}$ to the passage diameter $D_{13}$ along the mating surface 465 of the contact pad 456, the mating surface 465 faces the contact axis 408 of the body 402.

In some embodiments, a portion of the forces that maintain the electrical and mechanical engagement between the contact 400 and the contact pad 456 are made by the connector. For example, the connector may have the contact 400 coupled in a fixed relationship. To engage the contact 400 and the thru-hole 440, the leading end 404 of the body 402 may be inserted through the passage 458 along a mating direction $M_3$. The engagement projections 420 may resist movement toward each other when an interior surface of the passage 458 deflects the engagement projections 420 toward each other and the contact axis 408 so that the engagement projections are in the compressed condition 462 (FIG. 7). The leading end 404 of the legs 419 exits the passage 458 before the distal tips 422.

When the distal tips 422 of the engagement projections 420 clear the passage 458, a radially outward force $F_{R3}$ of each leg 419 pushes the distal tips 422 away from the contact axis 408 and into the mating surface 465 of the contact pad 456. The engagement projections 420 and the gripping edges 425 may be shaped to complement the orientation of the contact pad 456. As such, the distal tips 422 and the gripping edges 425 slide along the mating surface 465 until stopped by the mating surface 465. In the engaged condition as shown in FIG. 8, the legs 419 are a radial distance $R_{D4}$ away from the contact axis 408. The radial distance $R_{D4}$ may be less than the radial distance $R_{D3}$ (FIG. 6). The engagement projections 420 are shaped and oriented to resist being moved in a direction opposite to the mating direction $M_3$ along the longitudinal axis 490 after the engagement projections 420 have cleared and engaged the contact pad 456. Accordingly, due to the non-orthogonal angle $\theta_4$ of the mating surface 465, the radially outward force $F_{R3}$ may be translated into an axial force $F_{T4}$ against the contact pad 456. The radially outward and axial forces $F_{R3}$ and $F_{T4}$ may facilitate maintaining an electrical connection between the contact 400 and the contact pad 456.

Figure 9:
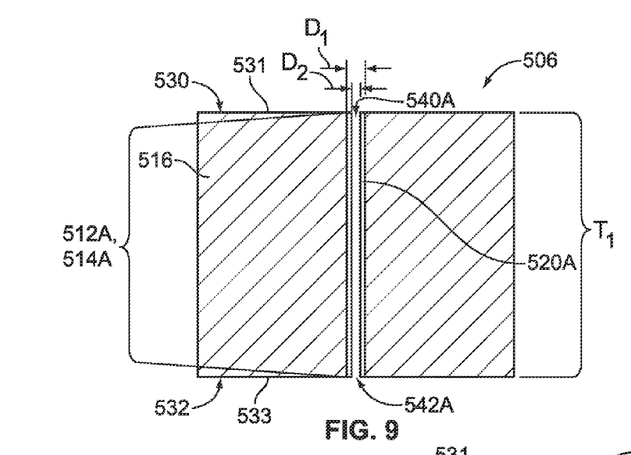
FIG. 9 is a cross-sectional side-view of a circuit board after one drilling process and before a plating process is applied to the circuit board.
Figure 10:
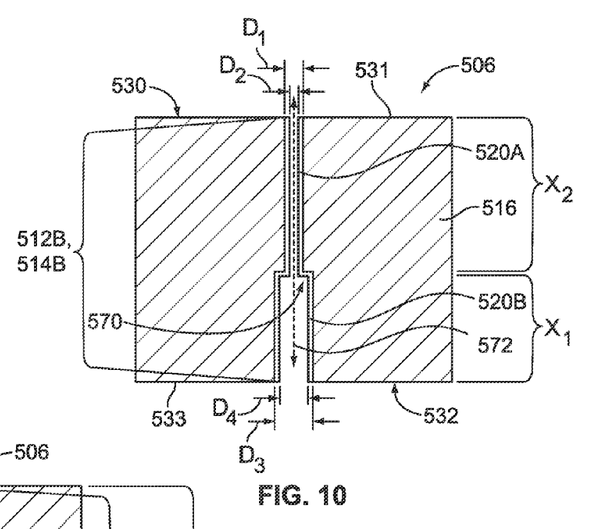
FIG. 10 is a cross-sectional side-view of the circuit board of FIG. 9 after a second drilling process and a first plating process.
Figure 11:
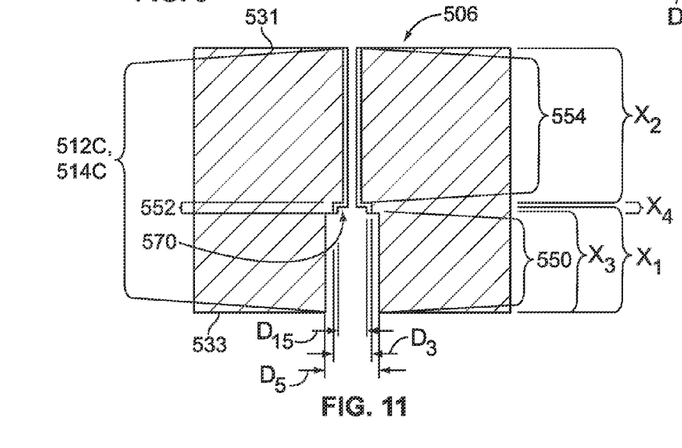
FIG. 11 is a cross-sectional side view of a circuit board formed in accordance with one embodiment.

FIGS. 9-11 are side cross-sectional views of a circuit board 506 showing various embodiments of a thru-hole 512 as the circuit board 506 is manufactured. (Different embodiments of the thru-hole 512 are indicated as thru-holes 512A-512C.) Each of the thru-holes 512A-512C and the circuit board 506 may be used with the electrical assembly 100 (FIG. 1) and, in some cases, the contacts 200 (FIG. 2), 300 (FIG. 4), and 400 (FIG. 6). Furthermore, although the following describes one method or process of manufacturing the circuit board 506, the circuit board 506 and, more specifically, the thru-holes 512A-512C may be manufactured in alternative embodiments.

FIG. 9 illustrates the circuit board 506 having a thru-hole 512A that includes a bore 514A and a conductive material 520A that is plated onto interior surfaces of the bore 514A. Thus, the bore 514A may have a diameter $D_1$, and the thru-hole 512A may have a smaller diameter $D_2$ due to a thickness of the plated conductive material 520A. As shown, the circuit board 506 has a substrate 516 formed from a dielectric material. The substrate 516 may have two or more layers (not shown) and one or more traces (not shown) extending therebetween or therein. The substrate 516 has a mating side 530 (also called a first side) and an opposing mounting side 532 (also called a second side) and a thickness $T_1$ extending therebetween. As used herein, "mating" and "mounting" are used to distinguish the opposite sides of the circuit board 506 and may be used interchangeably. Accordingly, the mating side 530 and/or the mounting side 532 may have an electrical component mounted thereon, and the mating side 530 and/or the mounting side 532 may be mounted onto any object or surface including another electrical component or circuit board. As shown, the mating side 530 includes a substrate surface 531, and the mounting side 532 includes a substrate surface 533. Although the substrate surfaces 531 and 533 are shown as being substantially planar, the substrate surfaces 531 and 533 (as well as the corresponding sides 530 and 532) may be non-planar with different levels, platforms, shelves, ridges, channels, grooves, and the like.

As shown in FIG. 9, the diameter $D_2$ of the thru-hole 512A may be uniform throughout the thickness $T_1$. Optionally, the thru-hole 512A may include a contact pad (not shown) that extends around an opening 540A along the substrate surface 531 and/or a contact pad (not shown) that extends around an opening 542A along the substrate surface 533. To make the bore 514A, a drill having a diameter $D_1$ may be drilled through the thickness $T_1$ of the substrate 516. The drill may be advanced through the entire thickness $T_1$ or only a portion thereof. After the bore 514A is drilled, the substrate 516 may undergo a plating process where the conductive material 520A is applied to an interior or bore surface of the bore 514A and, optionally, portions of the substrate surfaces 531 and 533. After the conductive material 520A is applied, the thru-hole 512A is formed. The thru-hole 512A may have the diameter $D_2$ that is less than the diameter $D_1$ of the bore 514A.

FIG. 10 is a side cross-sectional view of the circuit board 506 after an additional drilling process and an additional plating process. More specifically, a drill having a larger diameter than the diameter $D_1$ may be advanced from the mounting side 532 in an axial direction along the bore 514A (FIG. 9) an axial distance $X_1$ to make the bore 514B. As shown, a portion of the bore 514B extending from the substrate surface 531 has a diameter $D_1$ and a portion of the bore 514B extending from the substrate surface 533 the axial distance $X_1$ has a diameter $D_3$. The substrate 516 may be subjected to another plating process so that the bore 514B has conductive material 520B along the portion of the bore 514B extending the axial distance $X_1$ from the substrate surface 533. As shown in FIG. 10, the thru-hole 512B has the diameter $D_2$ along a portion of the bore 514B with the conductive material 520A, and a diameter $D_4$ along the portion of the bore 514B that extends the axial distance $X_1$ with the conductive material 520B. As described, the conductive materials 520A and 520B are applied in different processes. However, the bore 514B may be first formed from two separate drilling processes and then plated entirely with a common conductive material. Furthermore, the conductive materials 520A and 520B may be a common material or different materials.

As shown in FIG. 10, a mating surface 570 is formed by the conductive material 520A and 520B and is outward facing (i.e., faces an exterior of the circuit board 506 in a direction along a bore axis 572). The mating surface 570 may be sized and shaped to sufficiently engage with an electrical contact so that electrical signals may be transmitted therethrough. More specifically, the mating surface 570 may face and extend parallel to the substrate surface 533. Furthermore, the mating surface 570 may be located a depth away from the substrate surface 533 that is substantially equal to the axial distance $X_1$. As such, the mating surface 570 may be recessed with respect to the substrate surface 533.

FIG. 11 is a side cross-sectional view of the circuit board 506 after another drilling process with respect to the circuit board 506 shown in FIG. 10. More specifically, a drill having a larger diameter than the diameter $D_3$ may be advanced in an axial direction along the bore 514B (FIG. 10) from the substrate surface 533 to form the bore 514C. The bore 514C has a portion 550 extending from substrate surface 533 an axial distance $X_3$ into the substrate 516. The axial distance $X_3$ is less than the axial distance $X_1$ such that an intermediate portion 552 of the bore 514C is formed. As shown, the portion 550 does not have a conductive material along interior surfaces of the bore 514C. Accordingly, the thru-hole 512C includes the portion 550 extending from the substrate surface 533 and having a diameter $D_5$; the portion 554 extending from the substrate surface 531 an axial distance $X_2$; and the portion 552 extending between the portions 550 and 554 and having an axial distance $X_4$, which is the thickness $T_1$ (shown on FIG. 9) of the circuit board 506 minus the axial distances $X_2$ and $X_3$. Also shown in FIG. 11, the mating surface 570 and the portion 552 of the thru-hole 512C have a diameter $D_{15}$ that is substantially equal to the diameter $D_3$ (i.e., the diameter $D_3$ minus a thickness of the plated conductive material 520B (FIG. 10)), but less than the diameter $D_5$.

Figure 12:
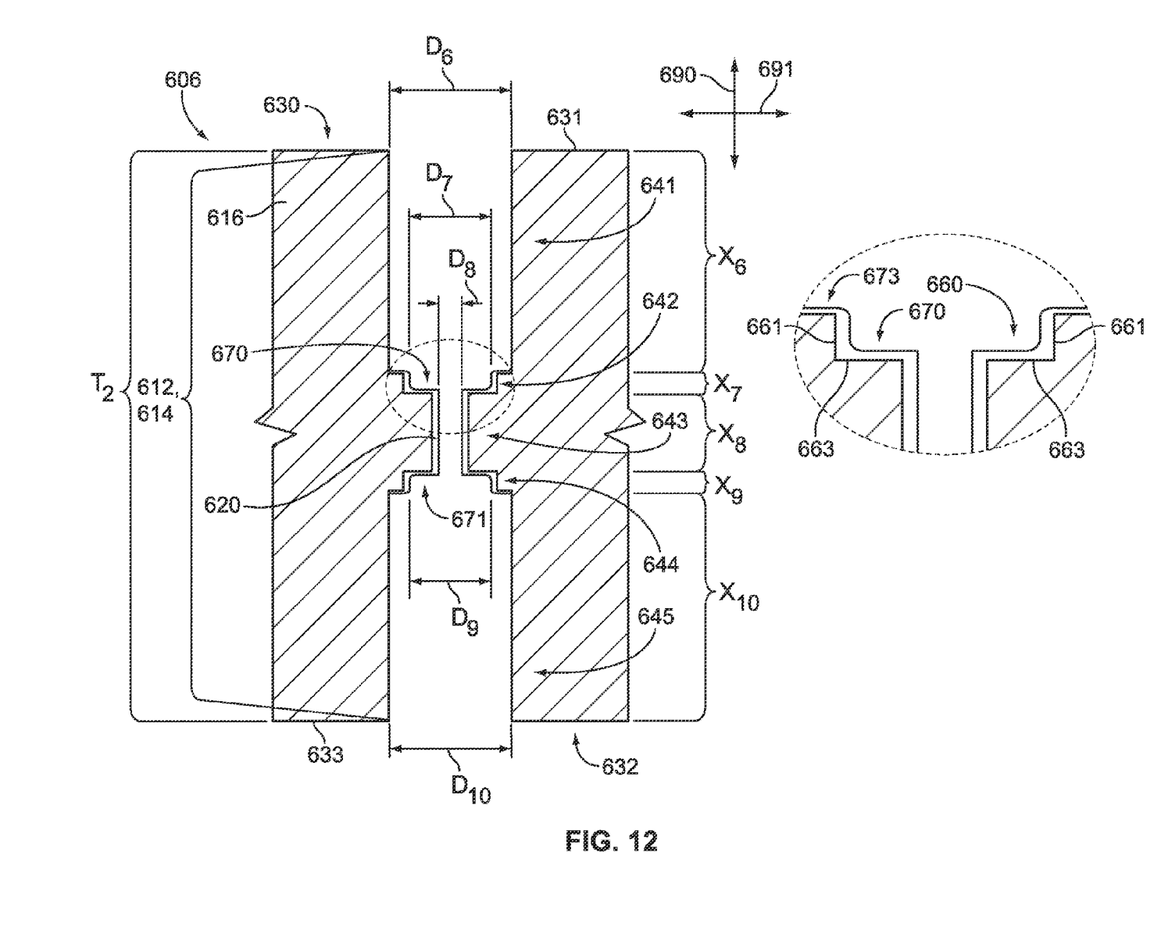
FIG. 12 is a cross-sectional side view of a circuit board formed in accordance with another embodiment.

FIG. 12 is a side cross-sectional view of a circuit board 606 that may be formed using similar drilling and plating processes as described above with respect to FIGS. 9-11. More specifically, the circuit board 606 may initially have a thru-hole, such as the thru-hole 512A shown in FIG. 9, that extends entirely through a thickness $T_2$ of a substrate 616 between substrate surfaces 631 and 633 of mating and mounting sides 630 and 632, respectively. The circuit board 606 may be drilled from both the substrate surfaces 631 and 633 in an axial direction and then subjected to another plating process. Subsequently, the circuit board 606 may be drilled again from both the substrate surfaces 631 and 633 to form a thru-hole 612 as shown in FIG. 12.

More specifically, the thru-hole 612 may have a bore 614 with conductive material 620 plated on a portion thereof. The thru-hole 612 may have a series of portions 641-645 that extend along a longitudinal axis 690 of the thru-hole 612. The portions 641-645 may or may not have a conductive material therealong. For example, the thru-hole 612 may have a non-plated portion 641 that extends from the substrate surface 631 an axial distance $X_6$ and with a diameter $D_6$; a plated portion 642 that extends from the portion 641 an axial distance $X_7$ and with a diameter $D_7$ that is smaller than the diameter $D_6$; a plated portion 643 that extends from the portion 642 an axial distance $X_8$ and with a diameter $D_8$ that is smaller than the diameter $D_7$; a plated portion 644 that extends from the portion 643 an axial distance $X_9$ and with a diameter $D_9$ that is greater than the diameter $D_8$; and a non-plated portion 645 that extends from the substrate surface 633 to the portion 644 an axial distance $X_{10}$ and with a diameter $D_{10}$ that is greater than the diameter $D_9$. In the illustrated embodiment, the diameters $D_9$ and $D_7$ are equal and the diameters $D_6$ and $D_{10}$ are equal. However, other sizes of diameters may be used and none of the diameters are required to be equal with any other diameter. Likewise, the axial distances $X_9$ and $X_7$ are equal and the axial distances $X_6$ and $X_{10}$ are equal in the illustrated embodiment. However, other lengths of axial distances may be used and none of the axial distances are required to be equal with any other axial distance.

The thru-hole 612 may have a pair of outward and opposite facing mating surfaces 670 and 671 that are sized and shaped to engage electrical contacts. The mating surface 670 may be recessed with respect to the substrate surface 631, and the mating surface 671 may be recessed with respect to the substrate surface 633.

Furthermore, as shown in the cut-out in FIG. 12, the thru-hole 612 may form a plated shelf portion 660 with the conductive material 620. More specifically, the shelf portion 660 includes a substantially longitudinal segment 661 that extends along a longitudinal axis 690 and a substantially radial segment 663 that extends along a lateral axis 691. The radial segment 663 includes the mating surface 670. The longitudinal segment 661 extends from the mating surface 670 to an intermediate substrate surface 673 that is located a depth within the bore 614. At least one of the longitudinal and radial segments 661 and 663 are configured to facilitate an electrical engagement between engagement projections of a contact (not shown) when the contact is electrically engaged with the conductive material 620. For example, if an engagement projection of the contact flexes out to the longitudinal segment 661, the engagement projection may engage the conductive material of the longitudinal segment 661 and the radial segment 663. In particular embodiments, the engagement projection of the contact primarily engages or only engages the conductive material of the radial segment 663.

Figure 13:
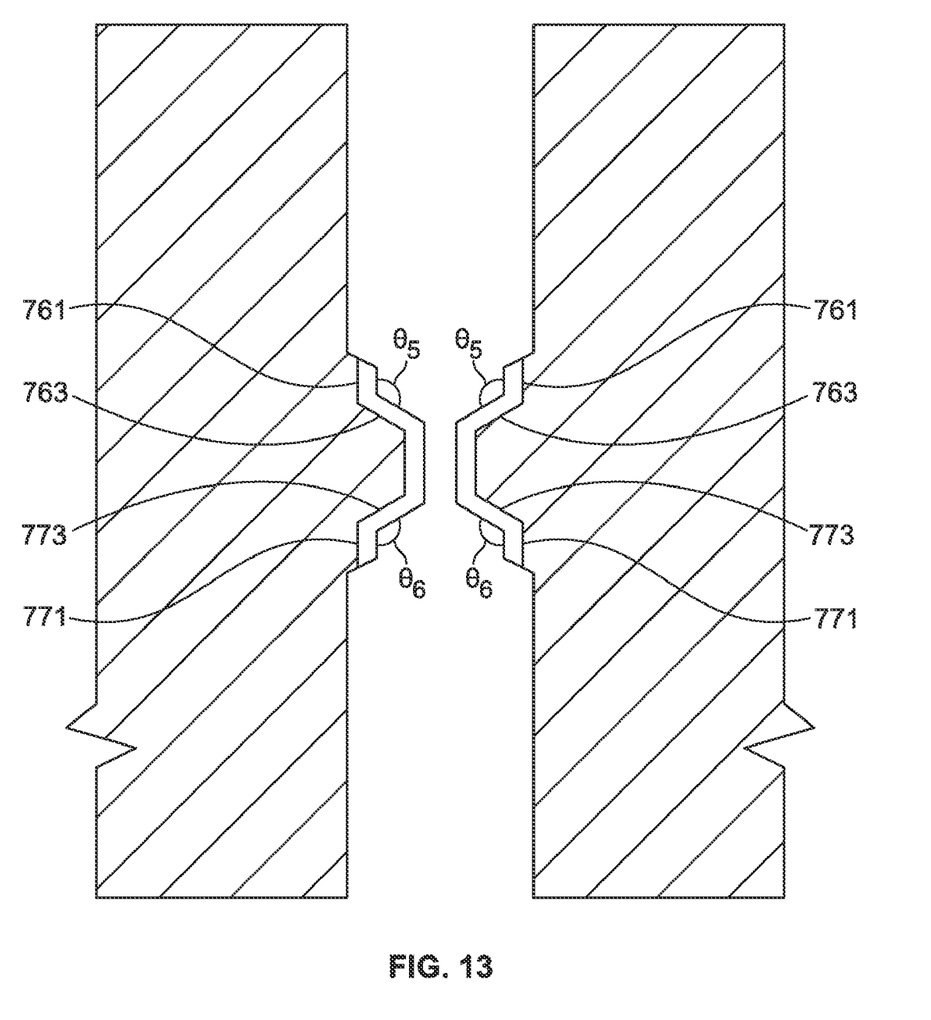
FIG. 13 is a cross-sectional side view of a circuit board formed in accordance with another embodiment.

As shown in FIG. 12, the longitudinal and radial segments 661 and 663 are substantially perpendicular. FIG. 13 illustrates an alternative embodiment where longitudinal and radial segments 761 and 763 and longitudinal and radial segments 771 and 773 are not perpendicular with respect to each other. For example, the longitudinal and radial segments 761 and 763 may form a non-orthogonal angle $\theta_5$, and the longitudinal and radial segments 771 and 773 may form a non-orthogonal angle $\theta_6$. The non-orthogonal angles $\theta_5$ and $\theta_6$ may be, for example, 60°, 100°, or 135°. As shown, the non-orthogonal angles $\theta_5$ and $\theta_6$ are substantially equal, however, the non-orthogonal angles $\theta_5$ and $\theta_6$ may be different depending upon the mechanical or electrical properties desired.

Thus, it is to be understood that the above description is intended to be illustrative, and not restrictive. In addition, the above-described embodiments (and/or aspects thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electrical component configured to engage a circuit board having a via, the via having a plated portion of conductive material that includes an outward facing contact pad, the component comprising:
   a housing having a mounting surface configured to be mounted to the circuit board; and
   an electrical contact coupled to the housing and projecting away from the mounting surface, the contact being configured to engage the via of the circuit board, the contact comprising:
      an elongated body extending along a contact axis to a leading end, the leading end being configured to be inserted into the via; and
      an engagement projection extending away from the body and being biased against the contact pad to maintain an electrical connection.

2. The electrical component in accordance with claim 1 wherein the engagement projection maintains an axial force against the contact pad in a direction that extends along the contact axis.

3. An electrical component configured to engage a circuit board having a via, the via having a plated portion of conductive material that includes an outward facing contact pad, the component comprising:
   a housing having a mounting surface configured to be mounted to the circuit board; and
   an electrical contact coupled to the housing and projecting away from the mounting surface, the contact being configured to engage the via of the circuit board, the contact comprising:
      an elongated body extending along a contact axis to a leading end, the leading end being configured to be inserted into the via; and
      an engagement projection extending away from the body and being biased against the contact pad to maintain an electrical connection, wherein the engagement projection is configured to flex toward the body when the body is inserted into the via and flex away from the body when the engagement projection has cleared the contact pad.

4. The electrical component in accordance with claim 1 wherein the engagement projection extends from the body to a distal tip of the engagement projection at an acute angle with respect to the contact axis.

5. The electrical component in accordance with claim 1 wherein the engagement projection includes a pair of engagement projections, the body further comprising a pair of legs extending alongside each other toward the leading end and separated by a gap, each leg including one of the engagement projections, wherein the legs flex toward each other when the engagement projections enter the via and flex away from each other when the engagement projections clear the contact pad.

6. The electrical component in accordance with claim 1 wherein the engagement projection is a first engagement projection and the contact further comprises a second engagement projection extending away from the body, the first and second engagement projections being separated from each other by an axial distance and configured to provide opposing axial forces when engaged to the via.

7. The electrical component in accordance with claim 1 wherein the contact further comprises a collar extending around the body about the contact axis, the collar and the engagement projection being separated from each other by an axial distance and providing opposing axial forces when engaged to the via.

8. The electrical component in accordance with claim 1 wherein the engagement projection extends from the body to a distal tip of the engagement projection, the engagement projection curving away from the body as the engagement projection extends to the distal tip.

9. A circuit board comprising a substrate having opposite substrate surfaces and a via having a plated portion of conductive material, the plated portion forming a contact pad that includes a mating surface sized and shaped to engage an electrical contact, wherein the mating surface faces one of the substrate surfaces, wherein the via includes a bore extending between the substrate surfaces, the contact pad being located a depth from said one of the substrate surface within the bore.

10. The circuit board in accordance with claim 9 wherein the via extends a length and the contact pad has a diameter, the length of the via being less than the diameter of the contact pad.

11. The circuit board in accordance with claim 9 wherein the contact pad has a diameter and the bore has a diameter, the diameters of the contact pad and the bore being substantially equal.

12. The circuit board in accordance with claim 9 wherein the contact pad has a diameter and the bore has a diameter, the diameter of the contact pad being less than the diameter of the bore.

13. The circuit board in accordance with claim 9 wherein the bore extends along a bore axis, the mating surface of the contact pad extending away from the bore axis at a non-orthogonal angle.

14. The circuit board in accordance with claim 9 wherein the contact pad is a first contact pad and the plated portion further comprises a second contact pad having a mating surface, the via extending between the first and second contact pads and the mating surfaces of the first and second contact pads facing substantially away from each other.

15. The circuit board in accordance with claim 14 wherein the opposite substrate surfaces are first and second substrate surfaces, the second contact pad being located a depth from the second substrate surface.

16. The circuit board in accordance with claim 9 wherein the via extends completely through the circuit board.

17. The circuit board in accordance with claim 14 wherein the plated portion forms a passage that extends continuously along the via between the first and second contact pads.

18. The electrical component of claim 1, wherein the engagement projection is configured to flex radially inward to a deflected position when the engagement projection is deflected by the via, the engagement projection being biased to flex radially outward from the deflected position.

19. The electrical component of claim 1, wherein the engagement projection includes a pair of the engagement projections, each of the engagement projections configured to be biased against the contact pad when engaged to the via.

20. The electrical component of claim 1, further comprising the circuit board, the circuit board having a substrate that includes the via and has opposite substrate surfaces, wherein the via includes a bore extending between the substrate surfaces, the contact pad being located a depth from said one of the substrate surfaces within the bore.

* * * * *